United States Patent [19]
Allison
[11] 3,748,546
[45] July 24, 1973

[54] PHOTOSENSITIVE DEVICE AND ARRAY

[75] Inventor: David F. Allison, Los Altos, Calif.
[73] Assignee: Signetics Corporation, Sunnyvale, Calif.

[22] Filed: May 12, 1969
[21] Appl. No.: 823,756

[52] U.S. Cl. ...... 317/235 R, 317/235 N, 317/235 F, 317/235 D
[51] Int. Cl. ........ H01l 15/00
[58] Field of Search ........ 317/234 M, 235 N, 317/235 F, 235 E, 235 D

[56] References Cited

UNITED STATES PATENTS

| | | | |
|---|---|---|---|
| 3,332,137 | 7/1967 | Kenney | 29/42.3 |
| 3,423,823 | 1/1969 | Ansley | 29/578 |
| 3,287,612 | 11/1966 | Lepselter | 317/235 |
| 3,616,348 | 10/1971 | Greig | 204/143 R |
| 3,488,636 | 1/1970 | Dyck | 340/173 |

OTHER PUBLICATIONS

Thomas, I.B.M. Technical Disclosure Bulletin, Vol. 5, No. 12, May 1963, page 67.

*Primary Examiner*—Martin H. Edlow
*Attorney*—Flehr, Hohbach, Test, Albritton & Herbert

[57] ABSTRACT

Photosensitive device having a back side surface which is provided with a substantially transparent insulating layer and at least a portion of which is exposed through the layer so that light can enter the phototransistor through the back side. In the array, a plurality of the photosensitive devices are provided in a predetermined pattern.

12 Claims, 5 Drawing Figures

INVENTOR.
David F. Allison
BY Flehr, Hohbach, Test, Albritton & Herbert
Attorneys INVENTOR.
David F. Allison
BY Flehr, Hohbach, Test, Albritton & Herbert
Attorneys

PHOTOSENSITIVE DEVICE AND ARRAY

BACKGROUND OF THE INVENTION

Phototransistors and photodiodes have heretofore been provided. In addition, such phototransistors and photodiodes have been provided in arrays of various types. However, in all of the phototransistors photodiodes and arrays, light entered the photosensitive devices through the top or front side of the phototransistor, photodiode or array. This has been found to have a number of disadvantages. For example, the metallization for making contact to the active regions of the phototransistors and the photodiodes is normally on the front side and, therefore, it interferes with the light impinging upon the device. In addition, in such devices particularly when they are provided in arrays, there is incomplete isolation between the devices. There is, therefore, a need for new and improved photosensitive devices and arrays made therefrom.

SUMMARY OF THE INVENTION AND OBJECTS

The photosensitive device consists of a body of semiconductor material having a front side surface and a back side surface. The body has a first region of one conductivity type and a second region of an opposite conductivity type formed within said first region and providing a first P-N junction which extends to the front side surface. An insulating layer covers the front side surface. Metallization extends through the insulating layer and makes contact with the first and second regions. A layer of insulating material covers the back side surface and is substantially transparent. At least a portion of the back side surface is exposed through the back side so that light can enter the semiconductor material from the back side. In the array, a plurality of photodiodes or phototransistors are provided in a predetermined pattern.

In general, it is an object of the present invention to provide a photosensitive device and an array which are sensitive to light from the back side.

Another object of the invention is to provide a device and array of the above character which has greatly increased sensitivity to light.

Another object of the invention is to provide an array of the above character in which there is isolation between the photosensitive devices.

Another object of the invention is to provide a device and array of the above character which can be utilized as memory elements.

Another object of the invention is to provide a device and array of the above character which can be readily fabricated.

Another object of the invention is to provide a device and an array of the above character which are particularly suitable for use at high frequencies.

Additional objects and features of the invention will appear from the following description in which the preferred embodiments are set forth in detail in conjunction with the accompanying drawing.

DESCRIPTION OF THE PREFERRED EMBODIMENTS

Figure 1:
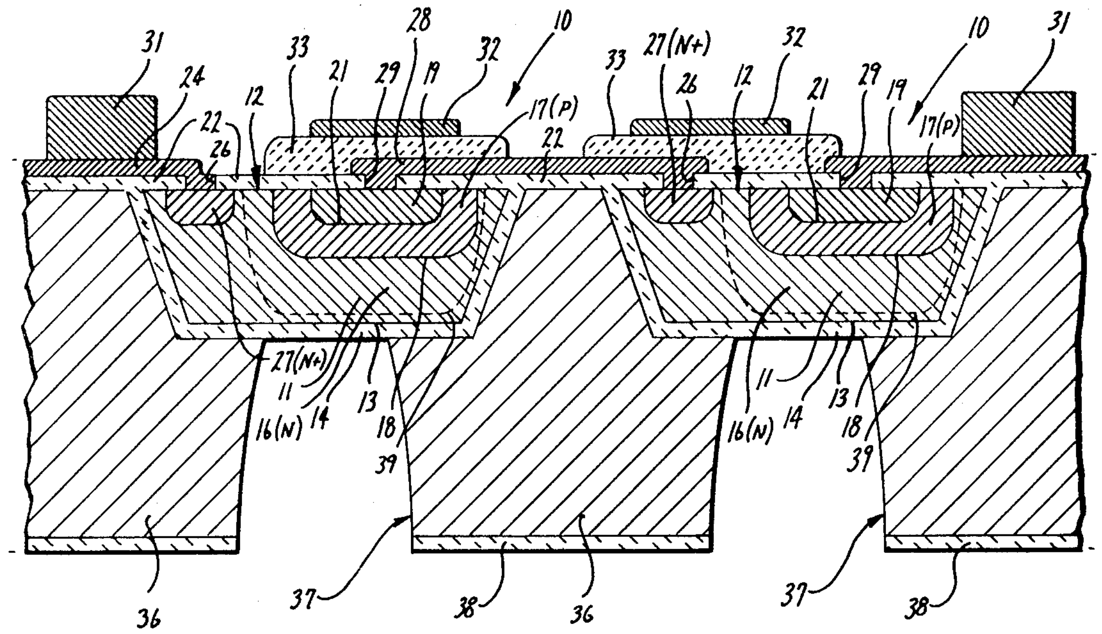
FIG. 1 is a cross-sectional view of an array formed by a plurality of phototransistors incorporating the present invention.

In FIG. 1, there is shown a cross-sectional view of photosensitive devices 10 formed in an array. The construction which is shown in FIG. 1 is similar in certain respects to that which is described in copending application Ser. No. 391,304 filed Aug. 24, 1964. As explained therein, with such a construction there is provided a plurality of islands 11 formed of a suitable semiconductor material such as silicon. The silicon should have a relatively high resistivity such as 2 – 6 ohm cm. However, even higher resistivity material can be utilized if desired. Each of the islands 11 is provided with a top side or front side surface 12 which is substantially planar and a back or bottom side surface 13 which is substantially dish-shaped. The islands 11 are dielectrically isolated from each other by a layer 14 which is provided on each of the islands on the back surface 13 so that the back surfaces of the islands are dielectrically isolated from each other. When the island is formed of silicon, the insulating layer 14 is typically a layer of silicon dioxide which is substantial'y transparent so that each of the devices 10 can act as a photosensitive device as hereinafter described.

All or only a portion of island 11 can be doped with an impurity to provide a first region of a first conductivity type. Thus, for example, this first or collector region 16 can be of an N conductivity type assuming that it is desired to make an NPN type device. A second or base region 17 is formed within the first region and has impurities therein of an opposite conductivity type so that a first P-N junction 18 is formed between the first and second regions which is substantially dish-shaped as shown and which extends to the top planar surface 12. If a photodiode is desired, only the first and second regions would be provided. However, when a phototransistor is desired, a third or emitter region 19 is formed within the second region off to one side of the second region and has impurities therein of said one conductivity type so that there is provided a second P-N junction 21 which is also substantially dish-shaped and extends to the planar front surface 12. A layer 22 of an insulating material overlies the front surface 12. Typically, this layer 22 is formed of silicon dioxide.

Metallization 23 is provided for making contact with the regions 16, 17 and 18 and consists of a lead structure 24 which makes contact through an opening 26 in the oxide layer 22 to make contact to the collector or first region 16. This contact is enhanced by a diffused N+ region 27 which is provided in the collector A lead structure 28 is provided for making contact to the emitter or third region 19 through an opening 29 in the oxide layer 22.

The devices 10 can be interconnected in any desired manner. For example, as shown, pillars 31 can be provided which are bonded to the lead structure 24. In addition, a second layer of metallization can be provided which takes the form of an elongate conductor 32 that is deposited on a layer 33 of insulating material which is deposited over the lead structure 28. The layer of insulating material 33 can be a dielectric which is deposited at low temperatures.

Means is provided for bonding the devices 10 into a unitary assembly and consists of a support structure 36 which can be formed of any suitable material such as polycrystalline silicon. It is not necessary that the support structure 36 be formed of an insulating material because the layers 14 serve to dielectrically isolate each of the islands from each other. Holes or openings 37 are formed in the support structure 36 so as to expose at least a portion of the bottom side of the layer 14 which covers each of the islands so that light can pass through the support structure and through the layer 14 and enter the island 11. The Holes have a size which is generally less than that of the island and are centered with respect to the device.

The holes 37 can be formed in any suitable manner; for example, they can be etched into the support structure by the utilization of conventional oxide etching procedures. For example, an oxide layer 38 can be provided on the bottom surface of the support structure 36 and thereafter by photolithographic techniques, a mask can be provided so that the oxide layer 38 is only etched at the points where holes are to be formed in the support structure 36. As soon as the oxide layer 38 has been etched away at the desired points, an etch can be utilized which will preferentially attack the polycrystalline silicon but which will not substantially attack the oxide layer 38. A typical etch suitable for this step would be a mixture of hydrofluoric acid and nitric acid. The etching continues downwardly through the support structure 36 until it comes into contact with the oxide layer 14 surrounding the islands 11. This oxide layer 14 serves as a stop for the etch. It is generally desirable that the hole 37 be sufficiently large so that light can readily pass through the hole and strike the substantially transparent oxide layer 14. Thus, by utilization of a selective etch, the etching will be stopped automatically at the oxide interface.

It should be appreciated that the holes 37 can be formed at any desired time. For example, if desired, the holes 37 coulbd could formed before any of the diffusion operations have been carried out in the islands 11 to provide the first, second and third regions. Alternatively, the holes could be formed after the diffusion steps have been completed but before the metallization of the leads has been applied. In general, it is only necessary that the islands 11 be formed and that they be dielectrically isolated from each other and that the islands be supported in a unitary assembly by the support structure. As soon as this has been completed, the holes 37 can be formed at any desired time thereafter.

In the fabrication of the islands 11, it is desired that the islands be of a controlled depth. This is particularly important because it is desired that the depletion layer which is formed during the operation of the device extend all the way downwardly to the dielectric isolation layer 14. Thus, for example, a typical thickness for a phototransistor incorporating the present invention would have an island with a thickness of approximately 10 microns to ensure that the depletion layer which is shown by a dotted line 39 extends all the way to the surface of the layer 14.

The mode of operation of the phototransistor and the array are very similar to the operation of conventional phototransistors. However, as pointed out previously, there are several very desirable features of the present construction. One of the principal features is that the light sources and the construction are arranged so that the back side of the construction which is shown in FIG. 1 are facing each other so the light thelight from the source will enter the holes 37 and enter each of the devices 10 through the portion of the oxide layer 14 which is exposed by the hole 37 to cause the phototransistor to operate. The phototransistor operates very efficiently because there is no metallization to interfere with the light which enters the device. The hole 37 is positioned in such a manner that the light which enters the device enters the device in the space charge region which ensures that the device will operate at a very high frequency. In conventional phototransistors, much of the light is collected in regions beyond the space charge region. In such a case, before response will occur, the carriers which are generated in the region beyond the space charge region must diffuse all the way through the depletion layer of the device before the device will respond.

When the devices are properly biased, the space charge region will reach the oxide layer. When this is the case, virtually all incident photons are effective in generating electron hole pairs to provide devices which are very sensitive and which have high frequency response.

With the geometry which is shown in FIG. 1, it is possible to readily achieve a frequency response of 1 Gigahertz. The transit times through a typical space charge sensitive device indicates that frequecies in the order of 10 Gigahertz are readily possible.

From the foregoing, it can be seen that the polycrystalline support structure can be etched away from the back side to expose at least a portion of the oxide interface. Because the light can enter from the back side, there is complete freedom in interconnecting the leads on the top or front side of the structure. Thus, if desired, third and fourth layers of metallization can be provided to make the necessary interconnections between the devices.

Figure 2:
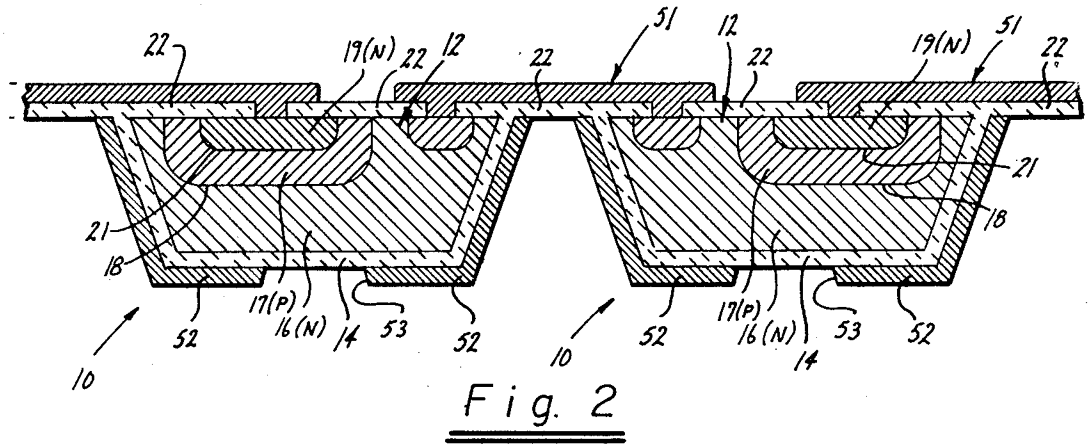
FIG. 2 is a cross-sectional view of an array incorporating another embodiment of the present invention utilizing beam leads.

Another embodiment of the invention is shown in FIG. 2 which is somewhat similar to that shown in FIG. 1. Thus, there have been provided islands 12 and first, second and third regions 16, 17 and 19, respectively, which form first and second P-N junctions 18 and 21. An oxide layer 22 is provided on the top surface of the islands. A beam lead construction 51 is provided for making contact to the emitter and collector regions of the photosensitive devices. This beam lead construction is described in copending application Ser. No. 748,040, filed July 26, 1968.

After the beam lead construction has been provided for retaining the separate devices 10 in a unitary assembly, all of the support structure formed of a suitable material such as polycrystalline silicon is removed by the use of a selective etch. The oxide layer 14 surrounding the island 11 again serves as a stop for the etch. After all of the polycrystalline support structure has been removed, a relatively thin opaque layer in the form of a metal layer 52 is provided on the back sides of the dielectrically isolated devices 10 by suitable means such as evaporating a layer of aluminum on the back sides. However, it should be noted that the layers 52 are spaced so that the layer for each device does not touch the layer for another device. Thus as shown, each layer covers the bottom side of the device and the inclined sides of the device but does not extend over to the next layer. Windows 53 are cut into the metallization layer 52 to expose at least a portion of the oxide layer 14 centrally of the bottom side of the island as shown in FIG. 2.

Operation of the phototransistor and the device is substantailly identical to the one hereinbefore described in FIG. 1. The windows 53 permit the light to enter the device within the space charge region of the device to obtain the highly sensitive, efficient operation at high frequencies as hereinbefore described with the previous embodiment.

Figure 3:
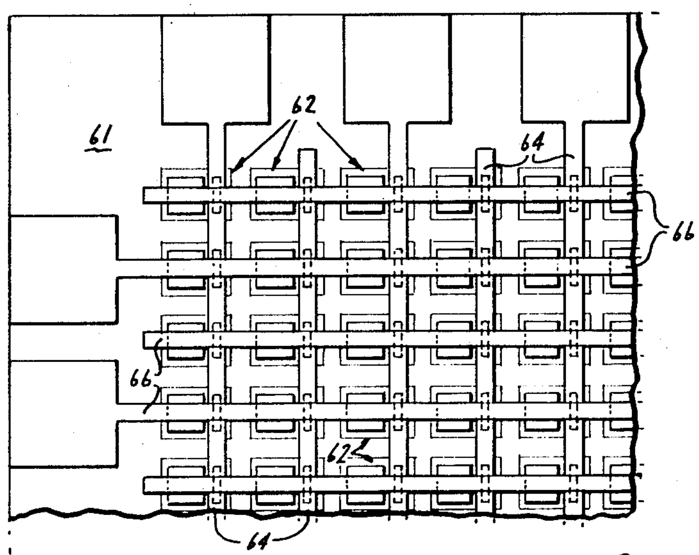
FIG. 3 is a partial top plan view of an array incorporating the present invention utilizing photodiodes.
Figure 4:
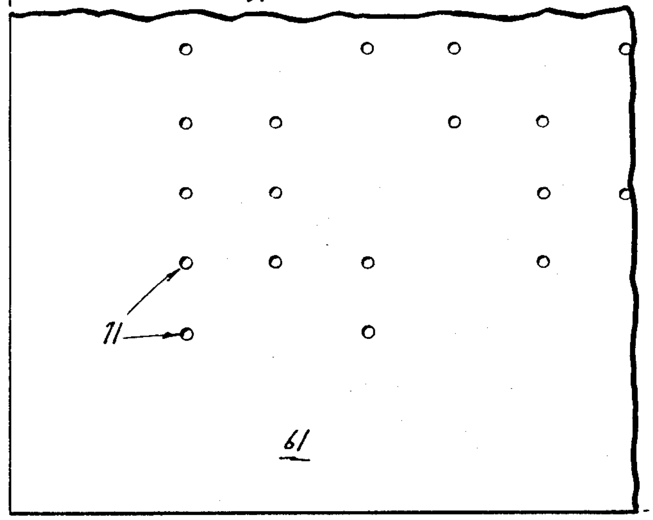
FIG. 4 is a portion of a bottom plan view of the array as shown in FIG. 3.

In FIGS. 3 and 4 there are shown top and bottom plan views of a memory incorporating the present invention. There is provided a body 61 of a semiconductor material in which a large number of photosensitive devices 62 have been formed. Thus, as shown in FIG. 3, these devices are in the form of photosensitive diodes having cathodes and anodes formed by the base and collector regions respectively and which are interconnected on the front sides of evaporated metal leads 64 and 66 provided on the front side of the semiconductor body. The back side of the semiconductor body 61 is provided with a pattern of holes 71 which extend through the support structure of the type hereinbefore described to expose the dielectric oxide layers 14 which serve to isolate the photosensitive devices from each other. If desired, the holes 71 can be positioned so that only certain devices are energized when a light is focused on the back side of the body 61. Such an arrangement makes it possible to place a pattern for a predetermined code in the body 61 so that in effect there is provided a fixed memory by such a device. Many different types of fixed memories can be provided by coding each of the bodies containing a plurality of the devices with a separate code. Alternatively, if desired, sufficient holes 71 could be provided for all the devices and then thereafter a metal layer could be placed over the same with the metal layer having the coded pattern of holes.

Figure 5:
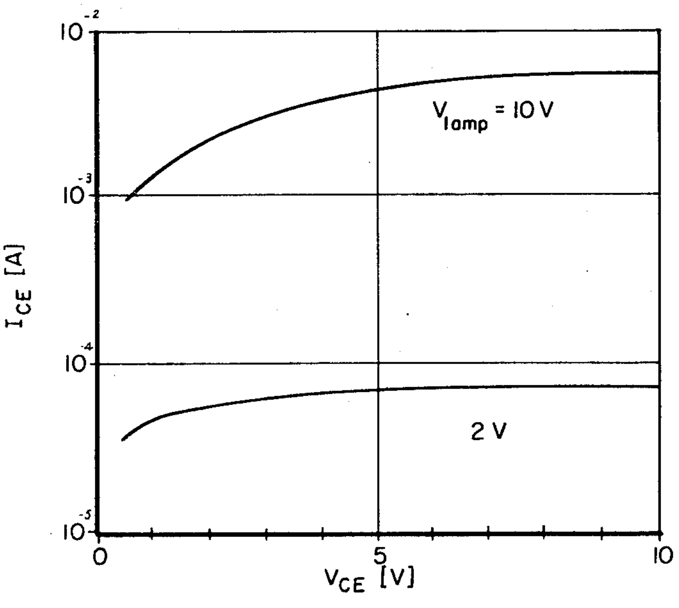
FIG. 5 is a chart showing typical operating characteristics of a phototransistor incorporating the present invention.

By way of example, photosensitive devices constructed in accordance with the present invention had the characteristics which are shown in the graph in FIG. 5. The collector-emitter current $I_{ce}$ is shown as a function of the collector-emitter voltage $V_{CE}$ for two different lamp voltages, one for 2 volts and the other for 10 volts. The curves show that the photosensitive devices is very efficient.

It is apparent from the foregoing that there has been provided a new and improved photosensitive device which is very efficient. In addition, it can operate at very high frequencies. It is such that it can be readily incorporated into arrays. The arrays can be utilized as fixed memories and the like. device

I claim:

1. In a photosensitive assembly, at least one photosensitive device, each device comprising a body of semiconductor material having a front side surface and a back side surface, said body having a region of one conductivity type formed therein, a region of a second conductivity type formed within said first region of the body and providing a first P-N junction which extends to the front side surface, an insulating layer covering said front side surface, and contact means extending through said insulating layer and making contact with said first and second regions, a layer of substantially transparent insulating material covering the back side surface of said body, a layer of opaque material disposed on said substantially transparent insulating material, said layer of opaque material having an opening formed therein to permit light to pass through a portion of said substantially transparent insulating material and enter the semiconductor material from the back side.

2. A photosensitive assembly as in claim 1 together with a third region of said one conductivity type formed in said second region and providing a second P-N junction which extends to said front side surface.

3. A photosensitive assembly as in claim 1 wherein said contact means is in the form of beam leads.

4. A photosensitive assembly as in claim 1 wherein said contact means is in theform of metallization deposited on said layer of insulating material the form said front surface.

5. A photosensitive assembly as in claim 1 wherein a plurality of said devices are provided which are dielectrically isolated from each other by said substantially transparent insulating layer and wherein said layer of opaque material functions as support means for supporting the devices in a unitary assembly.

6. A photosensitive assembly as in claim 5 wherein said layer of opaque material is in the form of a solid mass covering the substantially transparent insulating layer on the back sides of the devices and wherein said layer of opaque material has openings formed therein to permit light to pass through portions of said substantially transparent insulating layer for at least certain of the devices.

7. A photosensitive assembly as in claim 1 wherein a plurality of said devices are provided which are dielectrically isolated from each other by said substantially transparent insulating material, and wherein said contact means is in the form of beam leads and said beam leads serve as support means for supporting the devices in a unitary assembly.

8. A photosensitive assembly as in claim 7 wherein said layer of opaque material is in the form of a metal, said layer of metal being formed so that each device is isolated from the other devices.

9. A photosensitive assembly as in claim 5 wherein said openings in said layer of opaque material are substantially smaller in size than the devices and wherein the openings are centered with respect to the devices.

10. In a photosensitive array, a plurality of islands of semiconductor material having a front side surface and a back side surface, means carried by the back sides of each island for dielectrically isolating the islands from each other, each of said islands having a first region of one conductivity type and a second region of an opposite conductivity type within said first region and providing a first P-N junction which extends to the front side surface, contact means on the front side making contact with said first and second regions, said layer of insulating material carried by the back side of each of the islands being substantially transparent a layer of opaque material disposed on said substantially transparent insulating material, said layer of opaque material having selected openings formed therein to permit light to pass through portions of said substantially transparent insulating material and enter the semiconductor material from the back side.

11. An array as in claim 10 wherein at least certain of the islands have a third region of said one conductivity type formed within said second region to provide a second P-N junction which extends to the surface.

12. An array as in claim 11 wherein said islands are disposed in a predetermined pattern and wherein only a portion of said islands have openings formed in the layer of opaque material overlying the transparent insulating material on their back side in order to provide a predetermined code with the array.

* * * * *